(12) United States Patent
Hwang et al.

(10) Patent No.: US 9,876,497 B2
(45) Date of Patent: Jan. 23, 2018

(54) ACTIVE DIODE HAVING IMPROVED TRANSISTOR TURN-OFF CONTROL METHOD

(71) Applicant: MAPS, INC., Yongin-si (KR)

(72) Inventors: Jong-Tae Hwang, Seoul (KR); Hyun-Ick Shin, Seoul (KR); Sang-O Jeon, Suwon-si (KR); Joon Rhee, Seoul (KR)

(73) Assignee: MAPS, Inc., Yongin-si (KR)

( * ) Notice: Subject to any disclaimer, the term of this patent is extended or adjusted under 35 U.S.C. 154(b) by 161 days.

(21) Appl. No.: 14/898,958

(22) PCT Filed: Apr. 25, 2014

(86) PCT No.: PCT/KR2014/003692
§ 371 (c)(1),
(2) Date: Dec. 16, 2015

(87) PCT Pub. No.: WO2014/208885
PCT Pub. Date: Dec. 31, 2014

(65) Prior Publication Data
US 2016/0373109 A1 Dec. 22, 2016

(30) Foreign Application Priority Data
Jun. 27, 2013 (KR) .................. 10-2013-0074629

(51) Int. Cl.
*H03K 17/74* (2006.01)
*H02M 7/219* (2006.01)
(Continued)

(52) U.S. Cl.
CPC .............. *H03K 17/74* (2013.01); *H02M 1/08* (2013.01); *H02M 7/217* (2013.01); *H02M 7/219* (2013.01);
(Continued)

(58) Field of Classification Search
CPC ................................................ H03K 2017/307
See application file for complete search history.

(56) References Cited

U.S. PATENT DOCUMENTS 6,324,084 B1 11/2001 Fujisawa
6,815,940 B2 11/2004 Nakashimo
(Continued)

FOREIGN PATENT DOCUMENTS

CN  1289476 A  3/2001
CN  1420622 A  5/2003
(Continued)

OTHER PUBLICATIONS

International Search Report dated Aug. 1, 2014 in counterpart of International Application No. PCT/KR2014/003692. (5 pages with English translation).
(Continued)

*Primary Examiner* — Hai L Nguyen
(74) *Attorney, Agent, or Firm* — NSIP Law

(57) ABSTRACT

An active diode having an improved transistor turn-off control method is disclosed. The active diode comprises: a comparator for comparing voltages of both ends of a parasitic diode of a transistor; and a gate driver for controlling a gate terminal of the transistor according to the comparison result of the comparator, and estimates a turn-on time of the transistor and uses the same to control the gate terminal of the transistor.

11 Claims, 16 Drawing Sheets

(51) Int. Cl.
*H02M 7/217* (2006.01)
*H03K 3/012* (2006.01)
*H03K 17/13* (2006.01)
*H03K 17/687* (2006.01)
*H02M 1/08* (2006.01)
*H02M 1/00* (2006.01)
*H03K 17/30* (2006.01)

(52) U.S. Cl.
CPC .......... *H03K 3/012* (2013.01); *H03K 17/133* (2013.01); *H03K 17/687* (2013.01); *H02M 2001/0009* (2013.01); *H02M 2001/0051* (2013.01); *H03K 2017/307* (2013.01); *Y02B 70/1491* (2013.01)

(56) References Cited

U.S. PATENT DOCUMENTS 8,232,830 B2 * 7/2012 Takeshita .............. H02M 7/217
327/330
9,401,710 B2 * 7/2016 Hwang ................ H03K 17/302
9,419,608 B2 * 8/2016 Hwang ................ H03K 17/133
2006/0038523 A1 2/2006 Fujino et al.

FOREIGN PATENT DOCUMENTS

| JP | 6-284589 A | 10/1994 |
| JP | 2001-8494 A | 1/2001 |
| JP | 2001-008494 A | 1/2001 |
| JP | 4867279 B2 | 11/2001 |
| JP | 2003-309978 A | 10/2003 |
| JP | 2007-110869 A | 4/2007 |

OTHER PUBLICATIONS

Chinese Office Action dated Jul. 5, 2017 in counterpart Chinese Application No. 201480035880.4 (5 pages in Chinese).

* cited by examiner

ACTIVE DIODE HAVING IMPROVED TRANSISTOR TURN-OFF CONTROL METHOD

CROSS REFERENCE TO RELATED APPLICATION(S)

This application is a National Phase entry of PCT Application No. PCT/KR2014/003692, filed on Apr. 25, 2014, which claims priority under 35 U.S.C. §119(e), 120 and 365(c) to Korean Patent Application No. 10-2013-0074629, filed on Jun. 27, 2013 in the Korean Intellectual Property Office, the entire disclosures of each of which are incorporated herein by reference for all purposes.

TECHNICAL FIELD

The present invention relates to a rectifier, and more particularly, to an active rectifier which operates using active diodes.

BACKGROUND ART

FIG. 1 is a diagram illustrating a pre-existing active diode circuit, and FIG. 2 is a diagram illustrating an example of forward turn-on caused by delays that may occur due to both a comparator and a gate driver, which are illustrated in FIG. 1.

An active diode includes a switch M1; and due to MOSFET properties, a parasitic diode D1 is placed between a drain and a source. When VKA, which is the voltages at the opposite ends of the parasitic diode D1, i.e., the voltages at cathode K and anode A, turns negative so that D1 is turned on, the active diode detects this point in time and turns on the switch M1 to reduce conduction loss. However, as can be seen in FIG. 2, if there is a case where delays have occurred due to both a comparator 10 and a gate driver 20 are long, as illustrated in FIG. 2, a section where M1 is turned on may be created even though VKA has been turned to (+). Here, a forward turn-on of the active diode occurs, which leads to unnecessary consumption of power. If a control circuit has been designed to have minimal delays, the section duration of the forward turn-on may be reduced; however, some inevitable delays do occur, and if a VKA signal is very fast, the problem caused by the delays may be greater.

In other words, in the case a high-speed input signal is processed using the active diode, the active diode is turned on due to the delay of the control signal controlled caused by the comparator 10, the gate driver 20, etc. even when the active diode should be turned off, thus resulting in the forward turn-on of the active diode. Such properties are what lead to unnecessary consumption of power

Technical Problem

The purpose of the present invention is to provide an active rectifier that is capable of improving its power consumption.

Also, the purpose of the present invention is to provide an active rectifier that meets the fast dynamic properties.

Technical Solution

An active diode includes: a comparator to compare voltages at opposite ends of a parasitic diode of a transistor; and a gate driver to, in response to the comparison result of the comparator, control a gate terminal of the transistor, wherein the active diode estimates a time at which a transistor is turned on and use the estimated time to control the gate terminal of the transistor.

The active diode may further include an on-duration estimator to estimate the time at which the transistor is turned on by using an opposite-end voltage signal that shows whether voltages at opposite ends of the parasitic diode are positive or negative.

The on-duration estimator may include: a first capacitor to in response to the opposite-end voltage signal being negative, be charged according to levels of first and second signals that are generated from the opposite-end voltage signal; a second capacitor to in response to the opposite-end voltage signal being negative, be charged according to levels of first and second signals that are generated from the opposite-end voltage signal; and a third capacitor to in response to the opposite-end voltage signal being negative, be charged, wherein the active diode may compare a first or second reference signal to a comparison signal and estimate the time at which the transistor is turned on, wherein the first and second reference signals may be generated due to charging of the first and second capacitor, respectively, and the comparison signal is generated due to charging of the third capacitor.

A pulse level of the first signal may be changed for every period of the opposite-end voltage signal, and a pulse level of the second signal is changed according to a falling edge of the opposite-end voltage signal.

The first and second capacitors may have a same capacity, and the third capacitor may have a smaller capacity than the first and second capacitors.

The on-duration estimator may compare the comparison signal to a reference signal having bigger voltage among the voltages of the first and second reference signals The on-duration estimator may generate a signal for controlling the transistor to be turned off at a higher section than the reference signal to which the comparison signal is compared.

The active diode may further include an off-timing controller to control a point in time at which the transistor is turned off according to an estimation signal of the on-duration estimator and a gate drive signal of the gate driver.

The off-timing controller may include: an off controller to receive the estimation signal from the on-duration estimator and delay and output the received estimation signal based on inverted signals, which are each acquired by inverting an output signal of the comparator and the gate drive signal of the gate driver; and a logic circuit to receive the delayed output signal from the off controller and turn off the gate driver.

The off controller may include: a variable delay component to receive the estimation signal from the on-duration estimator and delay and output the received estimation signal according to a basic delay value and a variable additional delay value; and a counter to receive the inverted signals and count the additional delay value.

The counter may include a D flip-flop to receive the inverted signals; and an up/down counter to count up or down the additional delay value according to an output of the D flip-flop.

The off controller may further include a delay component to delay the inverted signal of the gate drive signal and output the delayed inverted signal to the D flip-flop.

The off controller may further include a delay component to delay the inverted signal of the gate drive signal and output the delayed inverted signal to the D flip-flop.

Advantageous Effects

Each of the active diodes comprising an active rectifier according to an exemplary embodiment can compensate for the delays of control signals by a comparator, a gate driver, etc., so as to turn off the active diodes at the point in time when being required to be turned off. In conclusion, the active rectifier adopting such active diodes creates efficiency of improving the power consumption.

Also, if the active rectifier is implemented with active diodes according to an exemplary embodiment of the present invention, such an active rectifier may create the efficiency of meeting the fast dynamic properties even in the case where the load connected to the rectifier is changed or the current scale and frequency of the input current are changed, and the like.

DESCRIPTION OF DRAWINGS

The accompanying drawings, which are included to provide a further understanding of the invention and are incorporated in and constitute a part of this specification, illustrate embodiments of the invention, and together with the description serve to explain the principles of the invention.

BEST MODE

The above-mentioned and additional aspects of the present invention may be clearer through preferred embodiments, which are described with reference to attached figures. Hereinafter, the present invention is specifically described so as to help those skilled in the art easily understand and implement the present invention through these exemplary embodiments.

Figure 3:
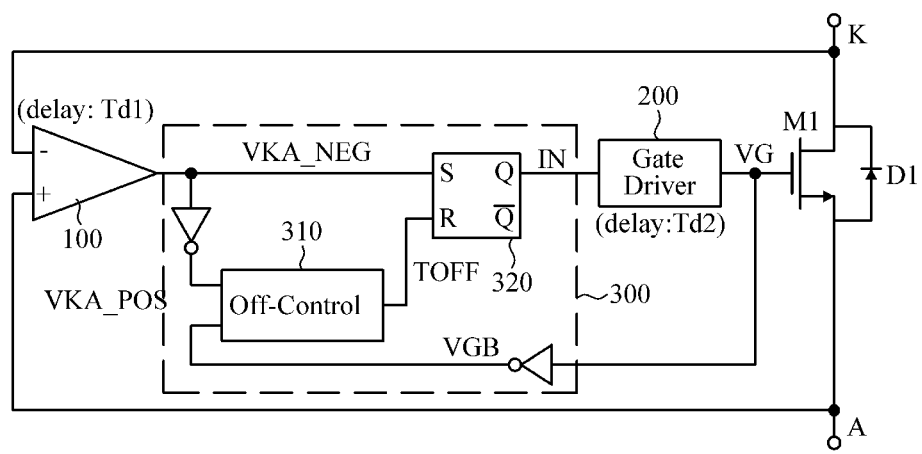
FIG. 3 is a diagram illustrating an example of an active diode circuit with an improved control method of a MOSFET turn-off.
Figure 4:
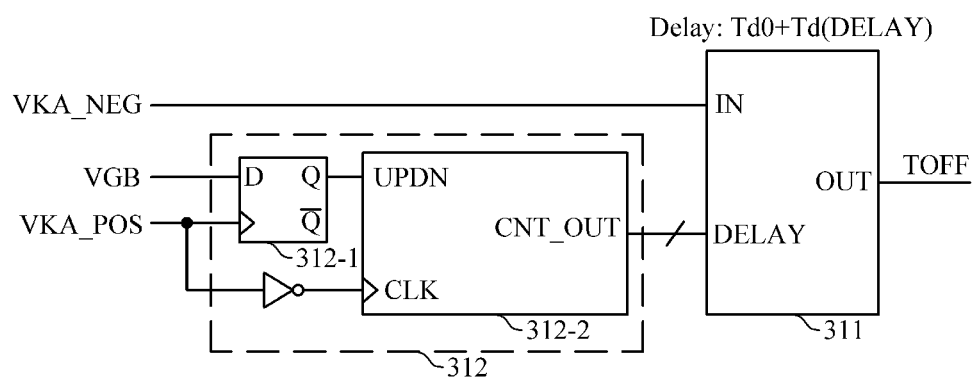
FIG. 4 is a diagram illustrating an example of an off-control circuit.

FIG. 3 is a diagram illustrating an example of an active diode circuit with an improved control of a MOSFET turn-off; and FIG. 4 is a diagram illustrating an example of an off-control circuit.

As illustrated in FIG. 3, an active diode includes a comparator 100 that compares the voltages at opposite ends of a parasitic diode D1 of M1; and a gate driver 200 that controls a gate terminal of M1 based on the comparison result of the comparator 100. The active diode according to an exemplary embodiment may further include an off-timing controller 300. The off-timing controller 300 controls M1 to be turned off at the point in time when VKA turns positive. According to an exemplary embodiment, the off-timing controller 300 may adjust the turn-off timing of M1 depending on an output signal from the comparator 100 and a gate drive signal from the gate driver 200.

As illustrated in FIG. 3, the off-timing controller 300 may include an off controller 310 and a logic circuit 320. The off controller 310 receives an output signal from a comparator 100 and outputs the received output signal; more specifically, it is the off controller 310 that determines the length of time the output is delayed in consideration of the inverted signals of both the output signal from the comparator 100 and of the gate drive signal from the gate driver 200, after which said off controller 310 delays the output as much as the determined delay time before it is sent out. When receiving the signal showing that the output has been delayed and output (hereinafter, referred to as 'delayed output signal') from the off controller 310 is received, the logic circuit 320 turns off the gate driver 200. As illustrated in FIG. 3, the logic circuit 320 may be an SR-latch.

As illustrated in FIG. 4, an off controller 310 may include a variable delay component 311 and a counter 312. The variable delay component 311 receives an output signal from a comparator 100 and outputs the signal to be delayed as much as the delay duration that has been determined according to a basic delay value and a variable additional delay value. The counter 312 counts the additional delay value by receiving the inverted signal of the output signal from the comparator 100 and that of the gate drive signal from the gate driver 200. As illustrated in FIG. 4, the counter 312 may include: a D flip-flop 312-1, to which the inverted signals of both the output signal from the comparator 100 and the gate drive signal from the gate driver 200 are input; and an up/down counter 312-2 that adjusts the additional delay value according to the D flip-flop 312-1.

Hereinafter, an operation of controlling a MOSFET turn-off of an active diode is described specifically with reference to FIGS. 3 and 4. The comparator 100 detects a voltage VKA and determines whether the detected voltage VKA is positive or negative. If the VKA is negative, VKA_NEG turns 'high'; and because VKA_NEG is the input S to the SR latch 320, the output of the SR latch 320 also turns 'high', which in turn makes for the input signal IN of the gate driver 200 to turn 'high', thus turning on M1. The off controller 310 is an off-control circuit that generates a TOFF signal by using a gate drive signal VG and the inverted signal of VKA_NEG. The TOFF signal is the input R (reset) of the SR latch 320, resulting in the output of the SR latch 320 becoming 'low'. Therefore, since the input signal IN of the gate driver 200 is 'low', M1 is turned off. Such a turn-off method allows the off controller 310 to generate an optimum off-time.

On the off-control circuit, the signal VKA_NEG passes through the variable delay component 311 and generates the TOFF signal. The variable delay component 311 has a basic delay of Td0, and generates the additional delay Td (DELAY) according to the input signal of the delay. Td0 is a value that is lower than half of the signal period of VKA. At the point in time when TOFF changes from low to high, the SR latch 320 in FIG. 3 is reset so that M1 is turned off. The off-control circuit in FIG. 4 compares the points in time when the rising edge of the signal VGB and the rising edge of VKA_POS occur. Here, said rising edge of the signal VGB is one that is generated by inverting the output signal VG from the gate driver 200. If the signal VG turns low at the point where VKA_POS is changed from low to high, it means that the on/off timing of the transistor is perfectly under control. Thus, the rising edge of VKA_POS is the control reference and the target as well.

Since the point in time when VKA_POS turns high is the point in time when the voltage VKA turns (+), if the point in time when the output signal VG from the gate driver 200 turns to a low level is at a later point in time than when VKA_POS turns high, the off timing of the gate driver 200 is required to be brought forward, or in the opposite case, is required to be push back. The D flip-flop 312-1 in FIG. 4 compares the phases of VGB and VKA_POS, wherein if VGB is high, i.e., M1 has been already turned off, at the point in time when VKA_POS turns high, the output Q turns high so as to increase the value of the up/down counter 312-2, or in the opposite case, decrease the value thereof. The variable delay component 311 changes the delay duration according to the output (DELAY) of the up/down counter 312-2. As the DELAY value becomes greater, the delay duration increases, so as to move back the point in time when M1 is turned off. The delay caused by the input DELAY of the variable delay component 311 may be shown as follows in Equation 1.

$$Td = Td0 + \Delta Td \times DELAY \quad (1)$$

In conclusion, Td determines the point in time when M1 is turned off, which is construed as determining an output pulse width of the gate driver 200.

Figure 5:
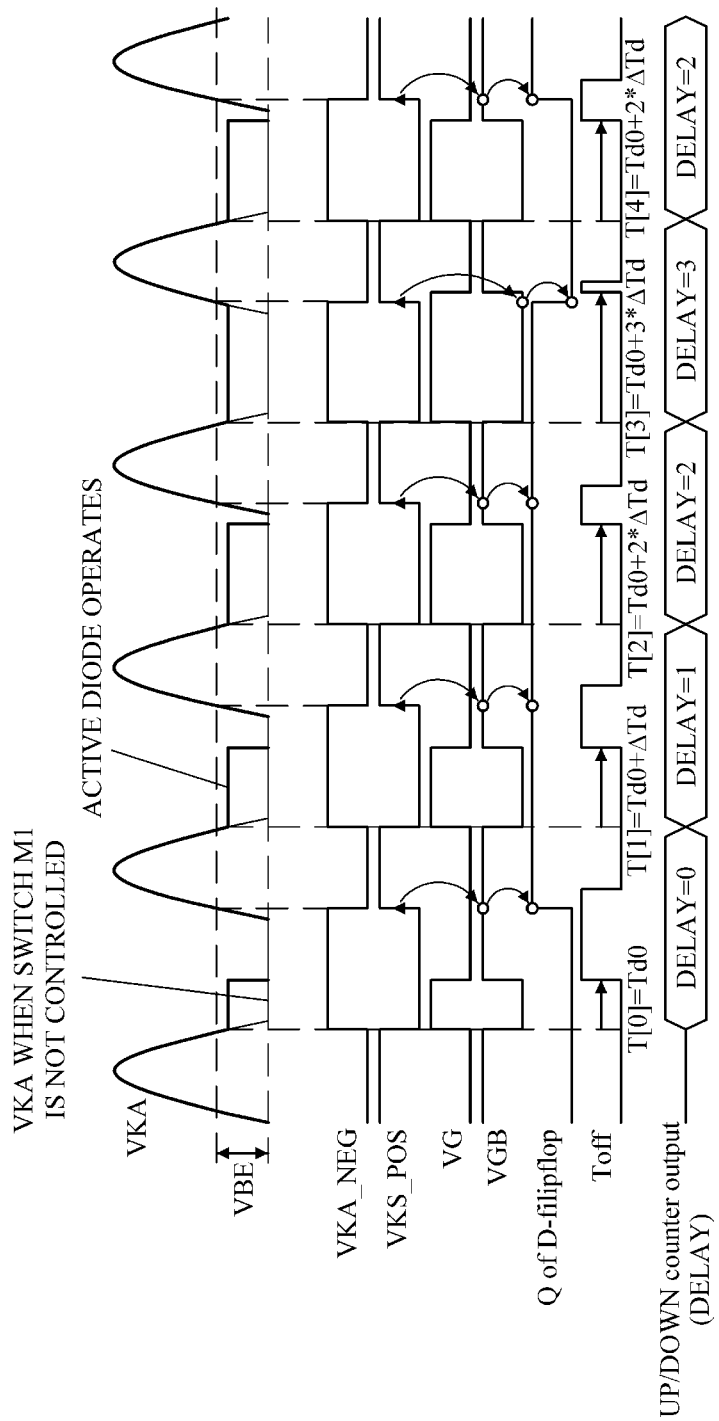
FIG. 5 is a diagram illustrating an example of operation timing of the off-control circuit illustrated in FIG. 4.

FIG. 5 is a diagram illustrating an example of operation timing of the off-control circuit according to an exemplary embodiment.

If a voltage VKA is lower than 0V, VKA_NEG turns high. VKA_POS is generated in the inverted form of VKA_NEG. In order to provide a description focused on operations, the delays caused by a comparator 100 and a gate driver 200 are not considered in FIG. 5. It is assumed that at the beginning, the up/down counter 312-2 is reset, to which the output DELAY is zero. Even though DELAY is zero, a variable delay component 311 still has an initial delay of Td0; this means VKA_NEG has a delay of Td0, which in turn generates a delayed TOFF signal. Here, since the point in time when VG turns low is faster than the point in time when VKA_POS turns high, the output of the D flip-flop 312-1 turns high, and the output of the up/down counter 312-2 increases by an increment of one at the rising edge of the inverted signal of VKA_POS. The output of the D flip-flop 312-1 is still high until the third cycle, but in the fourth cycle, the delay of the variable delay component 311 begins at a later time than the point in time when VKA_POS turns high, thereby resulting in the output of the up/down counter 312-2 being reduced by an increment of one.

After the fourth cycle, the output of the up/down counter 312-2 fluctuates between plus (+) or minus (−), thus entering into a steady state. Though somewhat exaggeratedly illustrated in FIG. 5, in the steady state, the TOFF timing is usually controlled consistently if the delay factor Δ Td, which is increased or decreased by DELAY, is a very small value. Thus, M1 is turned off in the optimum state. For convenience of description, the respective delays Td1 and Td2 of the comparator 100 and the gate driver 200 are assumed to be zero, but even though there are said delays present, the signal VGB of which phases are compared is generated by the delays Td1 and Td2 having been applied, thus the delays Td1 and Td2 being compensated to generate TOFF. Such controlling may be too difficult if the frequency of VKA were to change very rapidly in the above-mentioned operations, but in an application where the frequency of VKA is almost regular, an active diode may be turned off at the exact time according to the above-mentioned operations.

Figure 6:
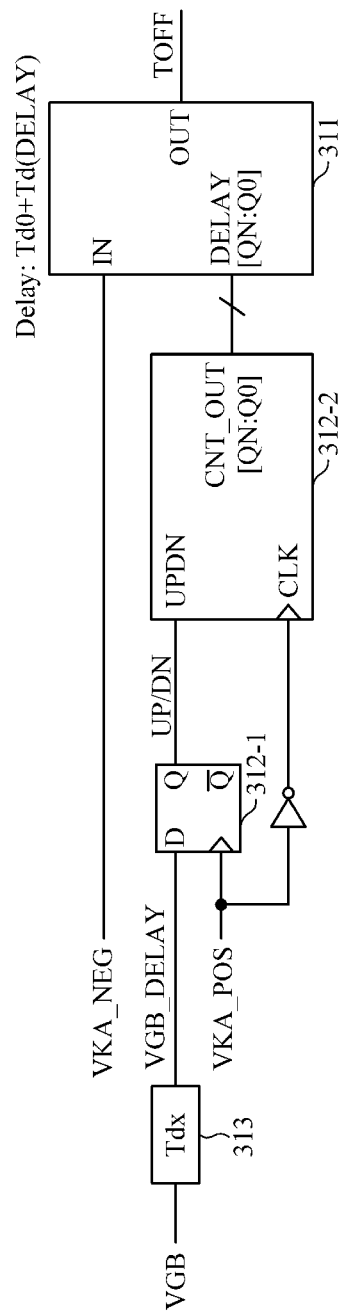
FIG. 6 is a diagram illustrating an example of an off-control circuit, in which delays that may occur due to both a comparator and a gate driver is compensated.

However, in an actual circuit, a delay may occur when the signal VKA_POS is generated. To compensate for this delay, an off controller 310 may further include a delay component 313, as illustrated in FIG. 6. The delay component 313 adds, to the signal VGB, a delay as much as $T_{dx}$ and inputs the result. Accordingly, the delay of VKA_POS generated by a comparator 100 and a logic circuit may be compensated.

In conclusion, an active diode according to an exemplary embodiment of the present invention detects the voltage VKA between the opposite ends of the diode, finds the point in time for the active diode to be turned off, and delays the signal that turns the active diode on so as to generate an off signal that turns off the active diode. Then, a variable delay circuit that generates a delay is controlled through a proposed controller so as to compensate for delays generated in a comparator, a gate driver, and a logic circuit, thereby performing the optimum operations.

Figure 7:
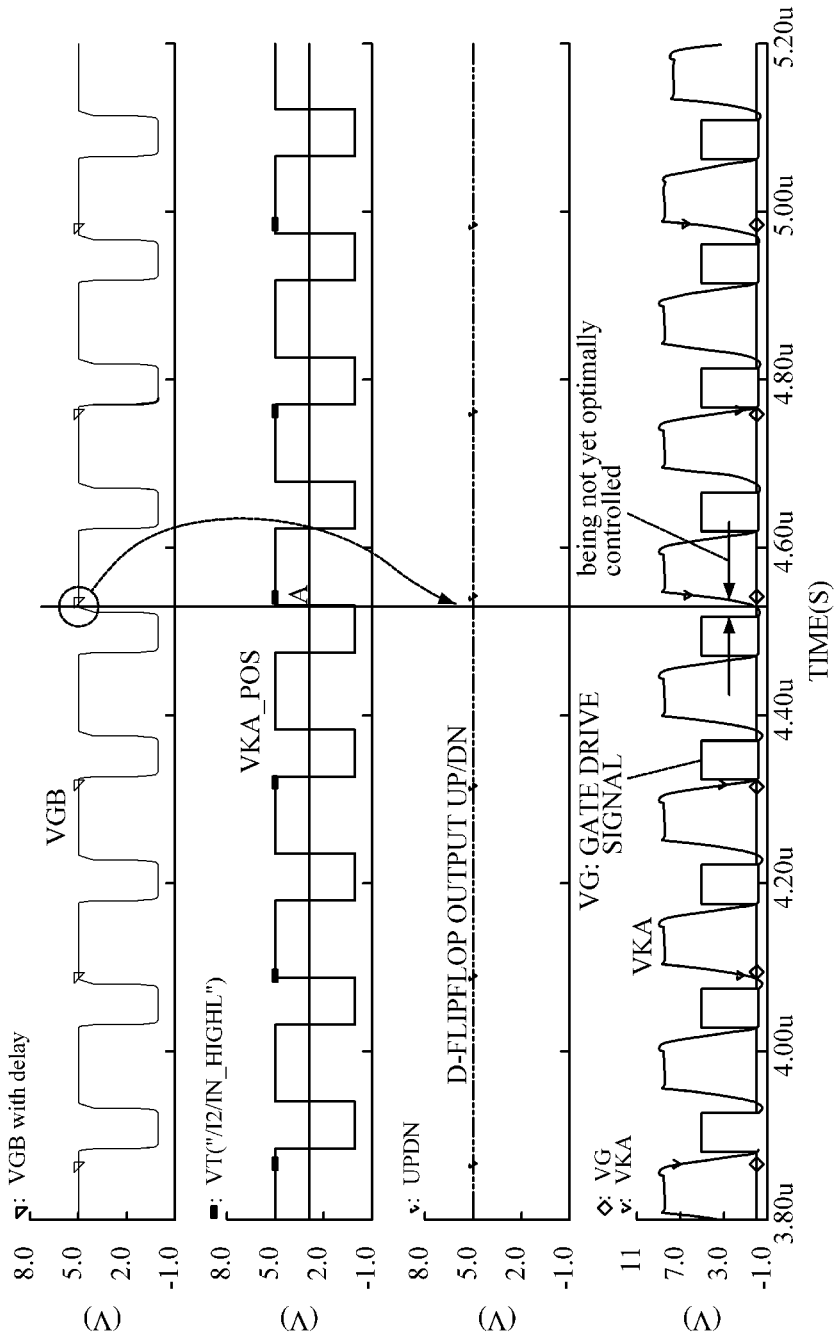
FIGS. 7 and 8 are diagrams illustrating simulations of off-control circuits according to an exemplary embodiment.
Figure 8:
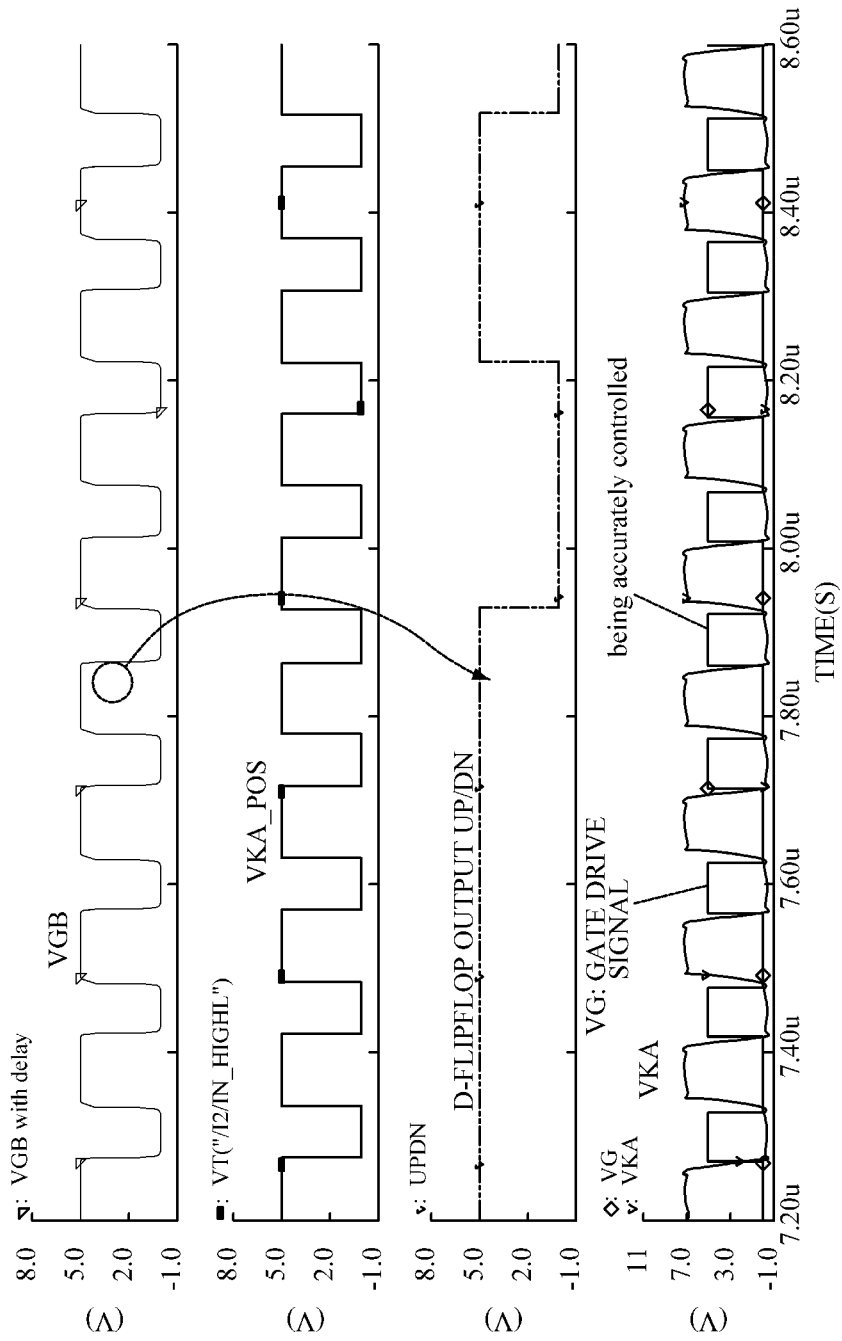

FIGS. 7 and 8 are diagrams illustrating simulations of off-control circuits according to an exemplary embodiment, wherein FIG. 7 illustrates a state in which a control of the off-control is not yet complete, and FIG. 8 illustrates a state in which a control of the off-control is complete.

As illustrated in FIG. 7, since the off-control is not completely controlled, the input UPDN of the up/down counter 312-2 is H. If the control of the off-control is complete, and then the output of the up/down counter 312-2 goes into a steady state, the output up/down of the D flip-flop is repeated as illustrated in FIG. 8 so that the delay is controlled, and the gate drive signal VG is generated by the delay compensations of the comparator 100, the gate driver 200, and the logic circuit.

Figure 9:
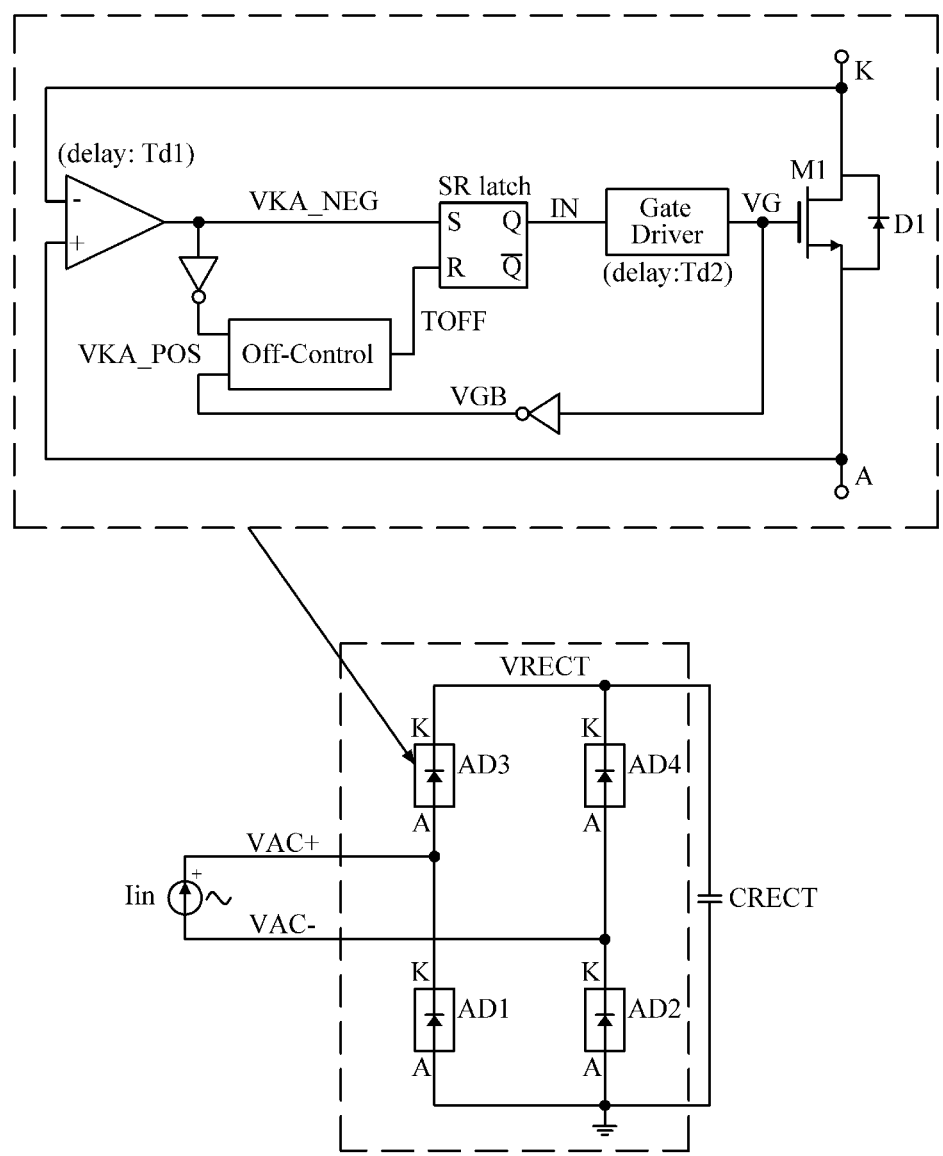
FIG. 9 is a diagram illustrating an example of an active rectifier circuit using an active diode with an improved control method of a MOSFET turn-off according to an exemplary embodiment.
Figure 10:
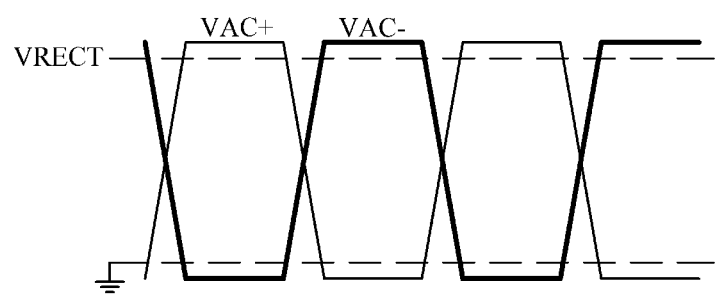
FIG. 10 is a diagram illustrating VRECT, VAC+, and VAC− waveforms of an active rectifier that is illustrated in FIG. 9.

FIG. 9 is a diagram illustrating an example of an active rectifier circuit using an active diode with an improved control method of a MOSFET turn-off according to an exemplary embodiment; and FIG. 10 is a diagram illustrating VRECT, VAC+, and VAC− waveforms of an active rectifier that is illustrated in FIG. 9.

By using the active diode described above, an active rectifier may be implemented as illustrated in FIG. 9. In a case of a rectifier using a general diode, of which a current flowing therein is IB, a power consumption as much as IB*VBE may occur due to a turn-on voltage drop and VBE of the diode. VBE may change according to diode types: for example, VBE of a Schottky barrier diode is approximately 0.3V, and for a P/N junction diode, approx. 0.6V. If an active diode is used, which is turned on by using MOSFET, the voltages at opposite ends of the active diode are determined by the turn-on resistance Rdson of MOSFET, i.e., IB*Rdson. In general, if a size of MOSFET becomes bigger, IB*Rdson<VBE is established, resulting in an improvement of a power consumption compared to a rectifier using a general diode. In FIG. 9, an active rectifier is implemented by using four active diodes AD1, AD2, AD3, and AD4, and a current source Iin, which is changed to a sign wave, is connected to a rectifier input. The current source Iin turns on an active diode, thereby making a smoothed voltage VRECT as illustrated in FIG. 9. Iin is a sign wave, which means a changing signal, thus changing a VAC+ voltage and a VAC− voltage as illustrated in FIG. 10.

The above-mentioned active diode determines a turn-on duration of an active diode so that an input current is efficiently transmitted to CRECT through an off-control circuit, but it is required to have a time taken to enter into a normal state, which is operated by an up/down counter 312-2. If a load connected to VRECT changes, or a current size and frequency of Iin changes a little, an active diode may not meet a fast dynamic characteristic due to the time taken to enter into a normal state. Thus, such a problem may be solved through an on-duration estimation (ODE).

Figure 11:
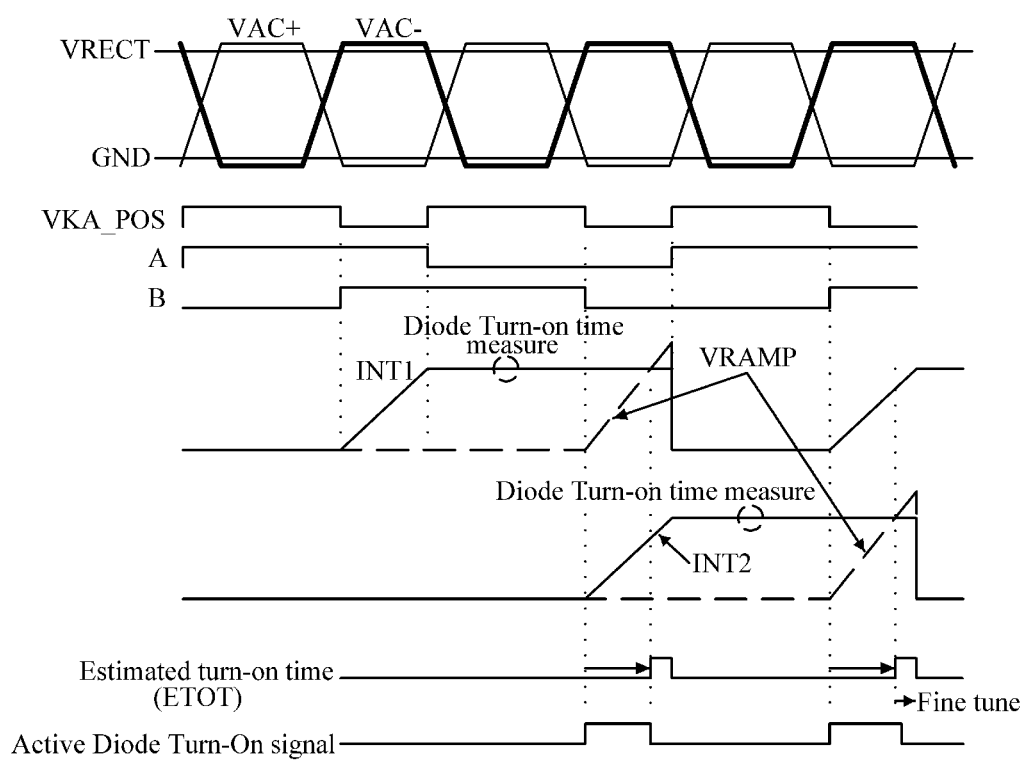
FIG. 11 is a diagram illustrating an operation waveform of an on-duration estimation (ODE) circuit according to an exemplary embodiment.
Figure 12:
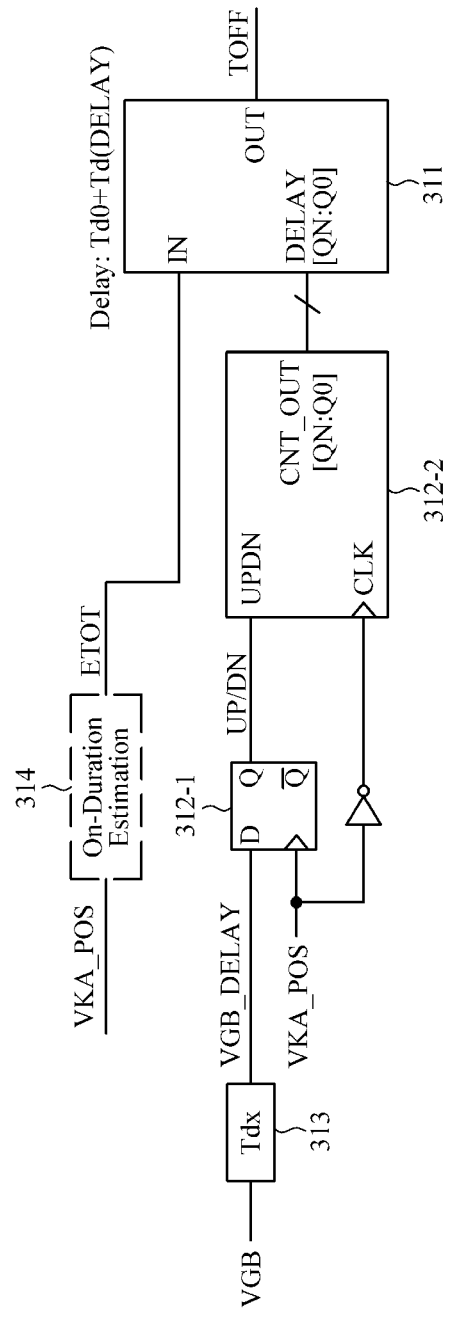
FIG. 12 is a diagram illustrating an example of an off-control circuit to which an on-duration estimator is added.

FIG. 11 is a diagram illustrating an operation waveform of an on-duration estimation (ODE) circuit according to an exemplary embodiment; and FIG. 12 is a diagram illustrating an example of an off-control circuit to which an on-duration estimator is added.

As illustrated in FIG. 11, operations will be described, which are with regard to AD1 of an active rectifier when VAC+ and VAC− are active as illustrated in FIGS. 11. AD2 to AD4 also perform the same operations as AD1. A VKA_POS signal is generated, which gives information that a voltage VKA of a diode is positive (+) through AC+ and GND voltage. Also, by using a VKA_POS signal, a first signal (signal A) and a second signal (signal B) are generated. As illustrated in FIG. 11, a pulse level of the signal A is changed for each one period of the VKA_POS signal, and a pulse level of the signal B is changed according to a falling edge of the VKA_POS signal. When VKA_POS is at a low level (L), i.e., a point in time when AD1 is required to operate due to the lowness of VAC+, if both A and B are at a high level (H), a signal INT is generated. The first reference signal INT1 is a signal, which is generated by charging a capacitor with a constant level of currents during a section where VKA_POS is at a low level (L). Thus, a voltage of INT1 is determined as shown in Equation 2.

$$INT1 = \frac{I}{C} \cdot TON \qquad (2)$$

Here, I indicates a current for charging a capacitor; C, capacitance; and TON, a section where VKA_POS=L is met. Thus, a peak voltage of INT1 is generated proportionally to the on-time of an active diode. This voltage is maintained until the next VKA_POS becomes L. Thus, a second reference signal INT2 is generated by using an additional capacitor, so as to measure the on-time during the next section where VKA_POS=L is met.

A VRAMP signal (a signal to be compared) is generated, wherein the VRAMP signal is compared to the INT1 signal already generated for the on-time estimation. VRAMP is set to be a little faster than a speed at which INT1 increases. Thus, VRAMP increases faster than INT1 and INT2 as illustrated in FIG. 11. If the INT1 voltage, determined first, is compared to a VRAMP voltage, a rough on-time may be estimated. VKA_POS is at a low level (L), and VRAMP generates a signal to turn on an active diode during a smaller section than INT1 or INT2. Through those processes, an estimated turn-on time (ETOT) may be generated, which is for an estimation and determination of rough on-time through the VKA_POS signal that has been generated before.

However, since ETOT is an estimated time, which does not indicate an accurate off-time, a perfect off-time is required to be determined. To that end, an off controller 310 according to an exemplary embodiment may be acquired by modifying the off-control circuit, illustrated in FIG. 6, to configure an off-control circuit that has an on-duration estimator 314 illustrated in FIG. 12. The on-duration estimator 314 estimates the on-time, which is 70~80% of a section where the previous VKA_POS is at a low level (L), and generates the ETOT. By using a variable delay component 311, said ETOT signal is finally fine-tuned so as to determine the accurate on-time.

Figure 1:
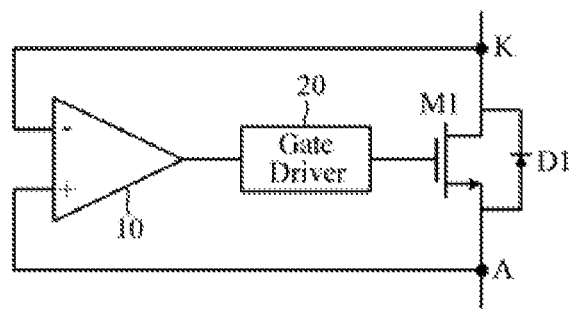
FIG. 1 is a diagram illustrating a pre-existing active diode circuit.
Figure 2:
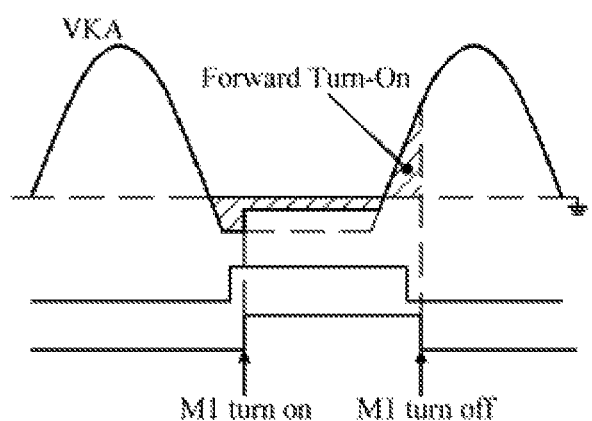
FIG. 2 is a diagram illustrating an example of forward turn-on caused by delays that may occur due to both a comparator and a gate driver, which are illustrated in FIG. 1.
Figure 13:
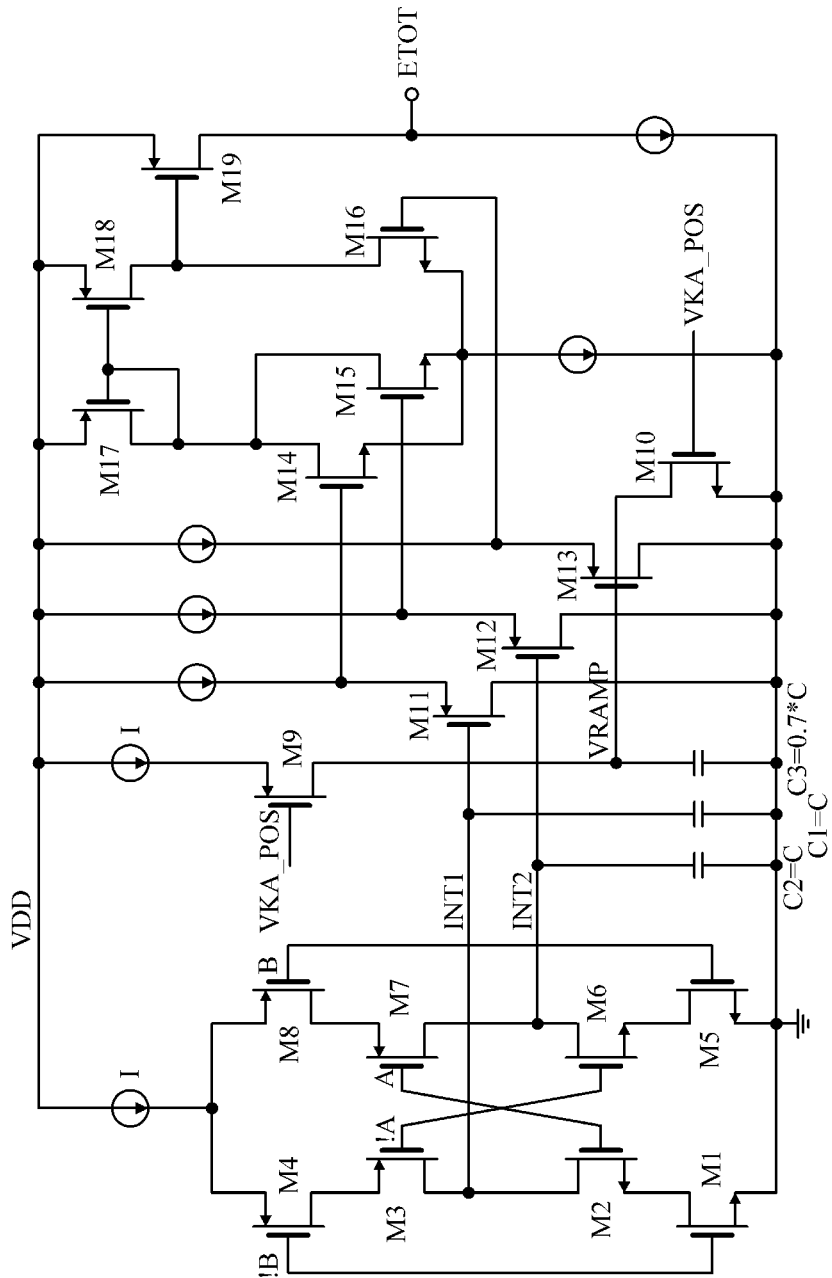
FIG. 13 is a diagram illustrating an on-duration estimation (ODE) circuit according to an exemplary embodiment.

FIG. 13 is a diagram illustrating an example of a circuit of an on-duration estimator illustrated in FIG. 2.

FIG. 13 is a diagram illustrating an example of an ODE circuit. If VKA_POS is at a low level (VKA_POS=L); A is at a high level (A=H); and B is at a high level (B=H), M4 and M3 are turned on so that current I charges a first capacitor C1 to generate an INT1 voltage. If both A and B are not at a high level (A=B=H), M3 and M4 are turned off so that INT1 does not increase more. C1 is reset and then ground, when A is at a high level of (A=H) and B is at a low level (B=L). If VKA_POS is at a low level (VKA_POS=L); A is at a low level (A=L); and B is at a low level (B=L), M7 and M8 are turned on so that current I charges a second capacitor C2 to generate an INT2 voltage. If both A and B are not at a low level (A=B=L), M7 and M8 are turned off so that INT2 does not increase more. If VKA_POS is at a low level (VKA_POS=L), M9 is turned on so that current I charges a third capacitor C3 to generate a VRAMP signal. Here, C3 is set to be approximately 0.7 times bigger than C1 and C2; VRAMP increases 1 or 0.7 times faster than INT1 or INT2. M14~M19 are comparator circuits, where if in response to a comparison of INT1 or INT2 to VRAMP, VRAMP is determined bigger, ETOT is at a high level (ETOT=H). M14 and M15 in a comparator is a circuit for detecting the maximum signal among two gate input signals. INT1 and INT2 are applied to the gates of M14 and M15 through a buffer circuit that includes M11 and M12. Since a gain of the buffer circuit is almost 1, size information of INT1 and INT2 may be applied to M14 and M15 while not being changed. Since among them, only the big signal is compared to VRAMP, the first ETOT illustrated in FIG. 11 has been acquired through a comparison of INT1 and VRAMP, and the next ETOT has been acquired through a comparison of INT2 and VRAMP. Then, comparison operations as above are repeated, according to which ETOT is generated. If VKA_POS is at a high level (VKA_POS=H), M10 is turned on, thereby C3 being discharged, and M10 is ready for generating a VRAMP signal again.

Figure 14:
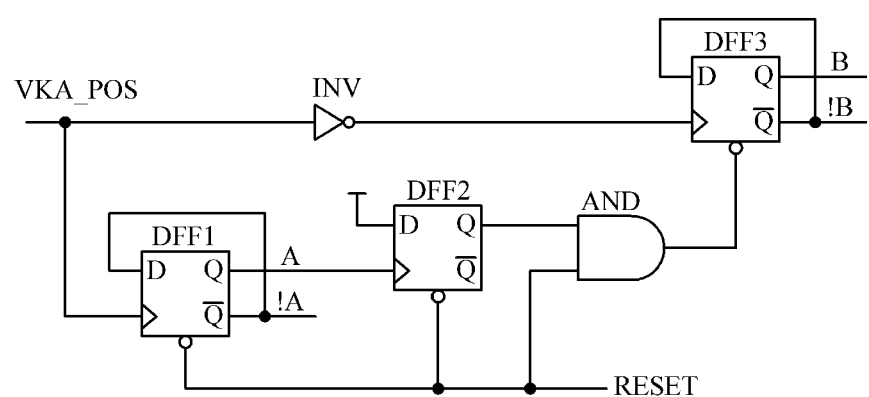
FIG. 14 is a diagram illustrating a circuit of a timing generator for generating a signal that is necessary for on-duration estimation according to an exemplary embodiment.

FIG. 14 is a diagram illustrating a circuit of a timing generator for generating a signal that is necessary for on-duration estimation according to an exemplary embodiment.

A timing generator illustrated in FIG. 14 generates A and inverted ! A by using VKA_POS and D flip-flop DFF1. To prevent a signal B from being generated before a first signal A is generated, it is set for DFF2 to reset DFF3 before the first signal A is generated. A signal RESET is to reset all DFF1, DFF2, and DFF3, and is generated once at the beginning.

Figure 15:
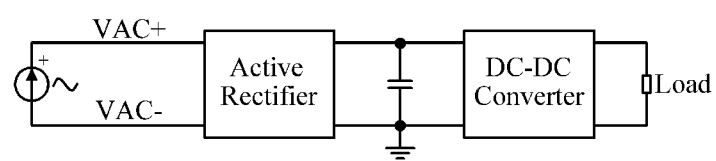
FIG. 15 is a diagram illustrating an example of a circuit in which an active rectifier according to an exemplary embodiment is coupled to a DC-DC converter.
Figure 16:
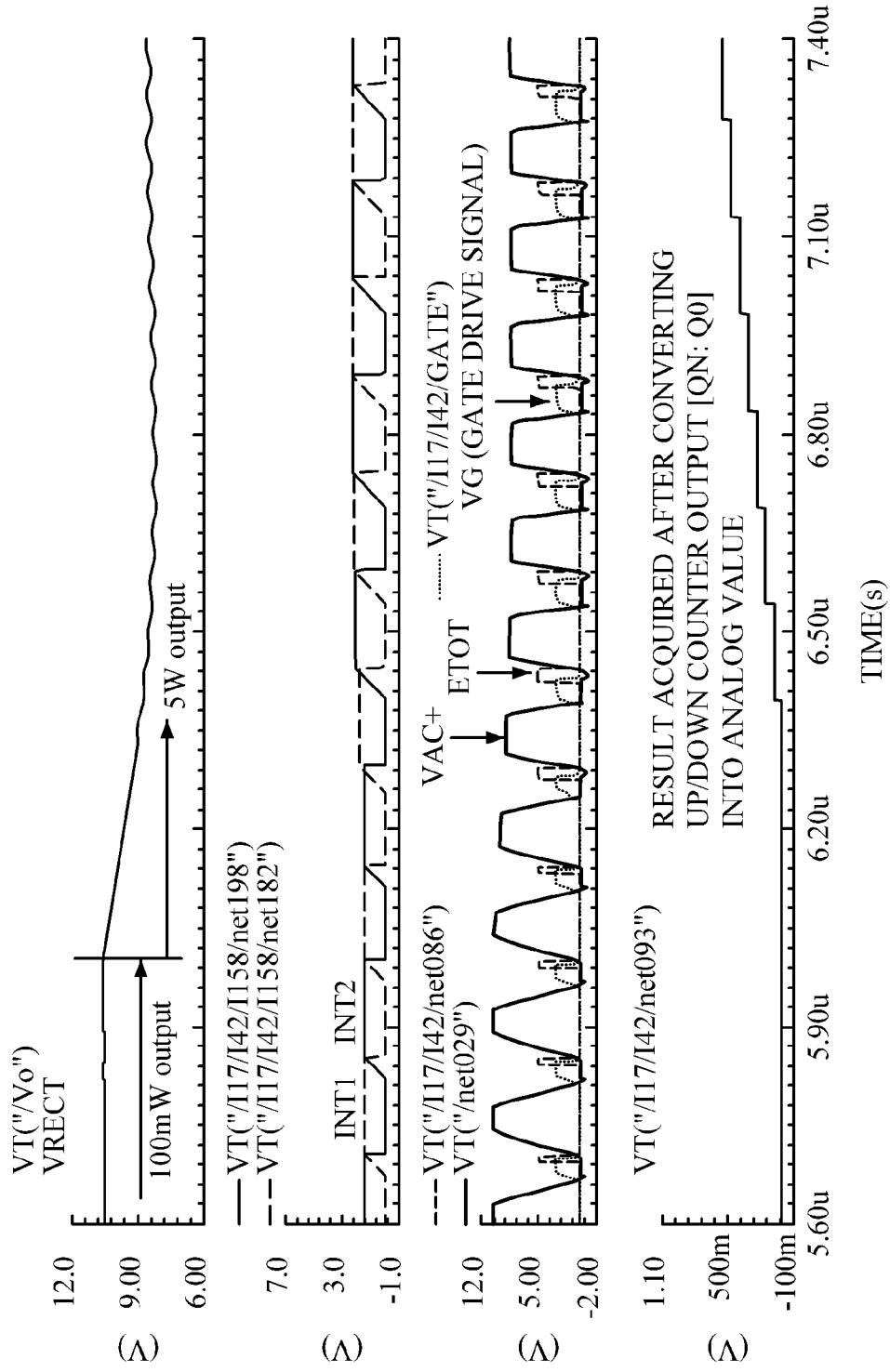
FIG. 16 is a diagram illustrating a simulation result of the circuit illustrated in FIG. 15.

FIG. 15 is a diagram illustrating an example of a circuit on which an active rectifier according to an exemplary embodiment is coupled to a DC-DC converter. FIG. 16 is a diagram illustrating a simulation result of the circuit illustrated in FIG. 15.

As illustrated in FIG. 15, an active rectifier according to an exemplary embodiment is connected to a DC-DC converter, and then a simulation, in which power, consumed by a load, increases from 100 mW to 5 W. As illustrated in FIG. 16, a load is increased, resulting in a reduction of a voltage VRECT, and VAC+ shows that a part below the ground is changing. INT1 and INT2 may be generated by an ODE circuit, and its peak value may change according to a change of a load. ETOT is generated through INT1 and INT2, and a point in time when an active diode turns on is roughly determined. Then, a delicate delay is controlled according to a control loop generated by an up/down counter 312-2, and a complete on-time (or MOSFET off-time) is determined. As described above, an active diode according to an exemplary embodiment may control an active rectifier to maximize effectiveness through a control circuit for turning off an active diode.

While this invention has been particularly shown and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

The invention claimed is:

1. An active diode circuit, comprising:
a transistor;
a parasitic diode placed between a drain and a source of the transistor, having and anode and cathode;
a comparator configured to compare voltages applied between the anode and the cathode of the parasitic diode;
a gate driver configured to, in response to the comparison result of the comparator, control agate terminal of the transistor;
an on-duration estimator configured to estimate the time at which the transistor is turned on by using an opposite-end voltage signal that shows whether voltages applied between the anode and the cathode at opposite ends of the parasitic diode are positive or negative; and
an off-timing controller configured to control a point in time at which the transistor is turned off according to an estimation signal of the on-duration estimator and a gate drive signal of the gate driver.

2. The active diode circuit of claim 1, wherein the on-duration estimator comprises:
a first capacitor configured to in response to the opposite-end voltage signal being negative, be charged according to levels of first and second signals that are generated from the opposite-end voltage signal;
a second capacitor configured to in response to the opposite-end voltage signal being negative, be charged according to levels of first and second signals that are generated from the opposite-end voltage signal; and
a third capacitor configured to in response to the opposite-end voltage signal being negative, be charged, wherein the active diode circuit is configured to compare a first or second reference signal to a comparison signal and estimate the time at which the transistor is turned on, wherein the first and second reference signals are generated due to charging of the first and second capacitor, respectively, and the comparison signal is generated due to charging of the third capacitor.

3. The active diode circuit of claim 2, wherein a pulse level of the first signal is changed for every period of the opposite-end voltage signal, and a pulse level of the second signal is changed according to a falling edge of the opposite-end voltage signal.

4. The active diode circuit of claim 2, wherein the first and second capacitors have a same capacity, and the third capacitor has a smaller capacity than the first and second capacitors.

5. The active diode circuit of claim 4, wherein the on-duration estimator is configured to compare the comparison signal to a reference signal having bigger voltage among the voltages of the first and second reference signals.

6. The active diode circuit of claim 5, wherein the on-duration estimator is configured to generate a signal for controlling the transistor to be turned off at a higher section than the reference signal to which the comparison signal is compared.

7. The active diode circuit of claim 1, wherein the off-timing controller comprises:
an off controller configured to receive the estimation signal from the on-duration estimator and delay and output the received estimation signal based on inverted signals, which are each acquired by inverting an output signal of the comparator and the gate drive signal of the gate driver; and
a logic circuit configured to receive the delayed output signal from the off controller and turn off the gate driver.

8. The active diode circuit of claim 7, wherein the off controller comprises:
a variable delay component configured to receive the estimation signal from the on-duration estimator and delay and output the received estimation signal according to a basic delay value and a variable additional delay value; and
a counter configured to receive the inverted signals and count the additional delay value.

9. The active diode circuit of claim 8, wherein the counter comprises:
a D flip-flop configured to receive the inverted signals; and
an up/down counter configured to count up or down the additional delay value according to an output of the D flip-flop.

10. The active diode circuit of claim 9, wherein the off controller further comprises:
a delay component configured to delay the inverted signal of the gate drive signal and output the delayed inverted signal to the D flip-flop.

11. The active diode circuit of claim 7, wherein the logic circuit is an SR latch configured to receive the output signal of the comparator through a set terminal thereof, and the delayed output signal of the off controller through a reset terminal thereof.

* * * * *